(12) United States Patent
Koifman

(10) Patent No.: US 7,612,586 B1
(45) Date of Patent: Nov. 3, 2009

(54) LOW NOISE ANALOG SAMPLING CIRCUIT AND A METHOD FOR LOW NOISE SAMPLING OF AN ANALOG SIGNAL

(75) Inventor: Vladimir Koifman, Rishon Lezion (IL)

(73) Assignee: Advasense Technologies (2004) Ltd., Raanana (IL)

(*) Notice: Subject to any disclaimer, the term of this patent is extended or adjusted under 35 U.S.C. 154(b) by 57 days.

(21) Appl. No.: 11/877,697

(22) Filed: Oct. 24, 2007

(51) Int. Cl.
*H03K 5/00* (2006.01)
(52) U.S. Cl. .................. 327/94; 327/91; 341/122
(58) Field of Classification Search .......... 327/91, 327/93, 94–96; 341/122–125
See application file for complete search history.

(56) References Cited

U.S. PATENT DOCUMENTS 5,479,121 A * 12/1995 Shen et al. ............... 327/94
2007/0035335 A1 * 2/2007 Lee ............................ 327/94

* cited by examiner

*Primary Examiner*—Long Nguyen
*Assistant Examiner*—Shikha Goyal
(74) *Attorney, Agent, or Firm*—Pearl Cohen Zedek Latzer, LLP (57) ABSTRACT

A low noise analog sampling circuit that includes a transistor connected to a first feedback loop and to a second feedback loop. During a second operational phase the second feedback loop provides the transistor a feedback signal that is responsive to an amplified error signal; wherein the error signal represents a difference between (i) a sampled signal representative of a state of the transistor short period before a first feedback loop was opened and (ii) a signal representative of a current state of the transistor; wherein at an end of the second operational phase the second feedback loop is opened and introduces a second noise that is attenuated by multiple capacitors.

16 Claims, 5 Drawing Sheets

LOW NOISE ANALOG SAMPLING CIRCUIT AND A METHOD FOR LOW NOISE SAMPLING OF AN ANALOG SIGNAL

FIELD OF THE INVENTION

The invention relates to a low noise analog sampling circuit and to a method for low noise sampling of an analog signal.

BACKGROUND OF THE INVENTION

Analog circuits as well as mixed signal circuits play a significant role in many modern electric circuits. Analog signals can represent light that impinges on a pixel, a vocal signal and the like.

The sampling of analog signals is characterized by various noises. One of these noises is known as the KTC noise. A sampling switch usually is connected to a capacitor. The sampling switch has a resistance and once the sampling switch is opened (disconnects one end of the sampling switch from the other) a noise is stored on the capacitor along with the instantaneous value of a voltage provided to the switch. The noise is characterized by a standard deviation that equals the square root of KT/C, where K is the Boltzmann constant, C is the capacitance of the capacitor and T is the temperature (Kelvin) of that capacitor.

The KTC noise as well as other noises can dramatically affect the accuracy of analog sampling circuits.

There is a growing need to provide low noise analog sampling circuits and methods for low noise sampling of analog signals.

SUMMARY OF THE INVENTION

A low noise analog sampling circuit that includes a transistor that is connected to a first feedback loop and to a second feedback loop. During a first operational phase, the first feedback loop is closed such as to affect a state of the transistor in response to an analog input signal; wherein at an end of the first operational phase the first feedback loop is opened and introduces a first noise. During a second operational phase the second feedback loop provides the transistor a feedback signal that is responsive to an amplified error signal, wherein the error signal represents a difference between (i) a sampled signal representative of a state of the transistor short period before the first feedback loop is opened and (ii) a signal representative of a current state of the transistor. At an end of the second operational phase the second feedback loop is opened and introduces a second noise that is attenuated by multiple capacitors of the second feedback loop such as to provide an attenuated second noise that substantially smaller than the first noise. During another operational phase the transistor outputs an output signal responsive to the analog input signal and to the attenuated second noise.

A method for low noise sampling of an analog signal, the method includes: (i) receiving an analog input signal; (ii) closing, during a first operational phase, a first feedback loop that is coupled to a transistor, such as to affect a state of the transistor in response to the analog input signal; (iii) opening, at an end of the first operational phase, the first feedback loop such as to introduce a first noise; (iv) providing, during a second operational phase, to the transistor and by a second feedback loop, a feedback signal that is responsive to an amplified error signal; wherein the error signal represents a difference between (a) a sampled signal representative of a state of the transistor short period before the first feedback loop is opened and (b) a signal representative of a current state of the transistor; (v) opening, at an end of the second operational phase, the second feedback loop such as to introduce a second noise; (v) attenuating the second noise signal by multiple capacitors of the second feedback loop, such as to provide an attenuated second noise that substantially smaller than the first noise; and outputting, during another operational phase, an output

BRIEF DESCRIPTION OF THE DRAWINGS

The present invention will be understood and appreciated more fully from the following detailed description taken in conjunction with the drawings in which.

DETAILED DESCRIPTION OF THE DRAWINGS

It is noted that various figures include capacitors. It is noted that these capacitors can represent parasitic capacitances, capacitor components or a combination thereof.

The term "state of a transistor" can be interpreted according to its ordinary meaning as well as including a current that flows through at least one node of the transistor, a voltage of one of the nodes of the transistor, a voltage difference between two nodes of the transistor and the like.

For simplicity of explanation an n-type NMOS transistor is illustrated in FIGS. 1-4. Those of skill in the art will appreciate that other types of transistors can be used as well as transistors that are fabricated by a technology that differs from MOS technology can be used.

It is noted that when a switch is closed it connects one of its terminals (ends) to another and when a switch is opened it disconnects one of its terminals (ends) from another.

Figure 1:
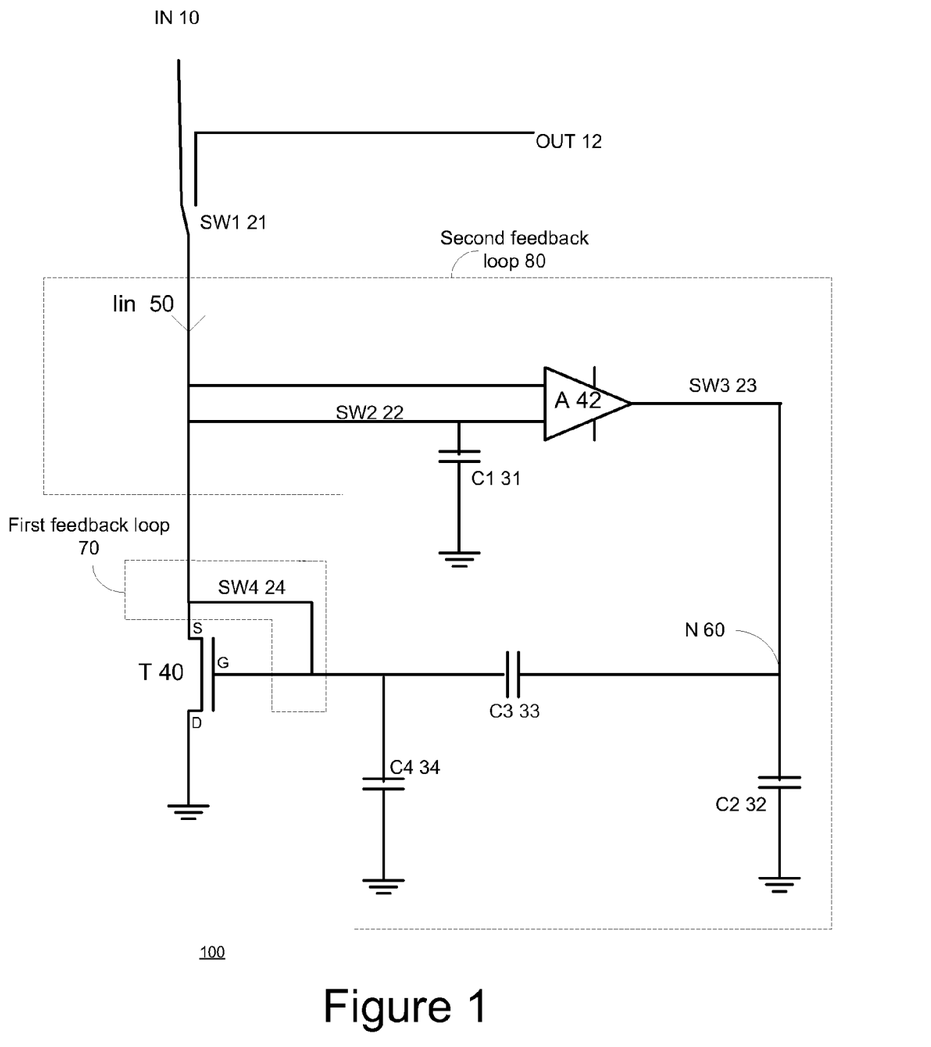
FIG. 1 illustrates a low noise analog sampling circuit during a first operational phase, according to an embodiment of the invention.

FIG. 1 illustrates low noise analog sampling circuit 100 during a first operational phase, according to an embodiment of the invention.

Low noise analog sampling circuit 100 includes: transistor T 40, first feedback loop 70, second feedback loop 80 and an input changeover switch (SW1 21). Input changeover switch SW1 21 can connect the drain of transistor T 40 to an input node (IN 10) of low noise analog sampling circuit 100 or to an output node (OUT 12) of low noise analog sampling circuit 100.

Low noise analog sampling circuit 100 can sample an analog input signal (such as input current Iin 50) that is received at an input node IN 10 and, after completing a sampling process, can provide to output node OUT 12 an output analog signal (Iout 52 of FIG. 4) that represents that input analog signal.

The output analog signal is only slightly affected by the sampling process as only a low level noise (an attenuated second noise) is added during the sampling process.

Transistor T 40 includes a gate, a source and a drain. These terminals are denoted G, S and D in FIGS. 1-4. The drain of transistor T 40 is connected to first node N1 61. The source is grounded.

Each of first and second feedback loops 70 and 80 is connected to the gate and to the drain of transistor T 40.

First feedback loop 70 includes fourth switch SW4 24. The first end of fourth switch SW4 24 is connected to the drain of transistor T 40. The second end of fourth switch SW4 24 is connected to the gate of transistor T 40.

Second feedback loop 80 includes second switch SW2 22, first capacitor C1 31, amplifier A 42, third switch SW3 23, second capacitor C2 32, third capacitor C3 33, and fourth capacitor C4 34.

The first end of fourth capacitor C4 34 and the second end of third capacitor C3 33 are connected to the gate of transistor T 40. The first end of third capacitor C3 33, the first end of second capacitor C2 32 and the second end of third switch SW3 23 are connected to each other at node N 60.

Amplifier A 42 includes a first input, a second input and an output. The first (inverting) input is connected to the drain of transistor T 40. The second (non-inverting) input of amplifier A 42 is connected to the second end of second switch SW2 22. The output of amplifier A 42 is connected to the first end of third switch SW3 23.

The gain of amplifier A 42 can change between one operational phase of low noise analog sampling circuit 100 to the other. The gain alteration can be achieved by selectively connecting amplifier A 42 to components such as capacitors and/or resistors but this is not necessarily so and variable gain amplifiers can be used.

Low noise analog sampling circuit 100 can operate at one of four operational phases. During a first operational phase the first and second feedback loops 70 and 80 are closed and the transistor T 40 can enter a steady state that is determined by analog input signal Iin 50.

Especially, the drain source current (not shown) of transistor T 40 is responsive to Iin 50, and this current sets the gate source voltage (Vgs) of transistor T 40.

At the end of the first operational phase first feedback loop 70 is opened (fourth switch SW4 24 is opened) and introduces a first noise at the gate of transistor T 40. Especially, the fourth capacitor C4 34 is charged with this noise. The first noise can be a KTC noise that is inversely proportional to a square root of the capacitance of forth capacitor C4 34.

In mathematical terms:

$$FirstNoise = \sqrt{\frac{KT}{C4}}.$$

Figure 2:
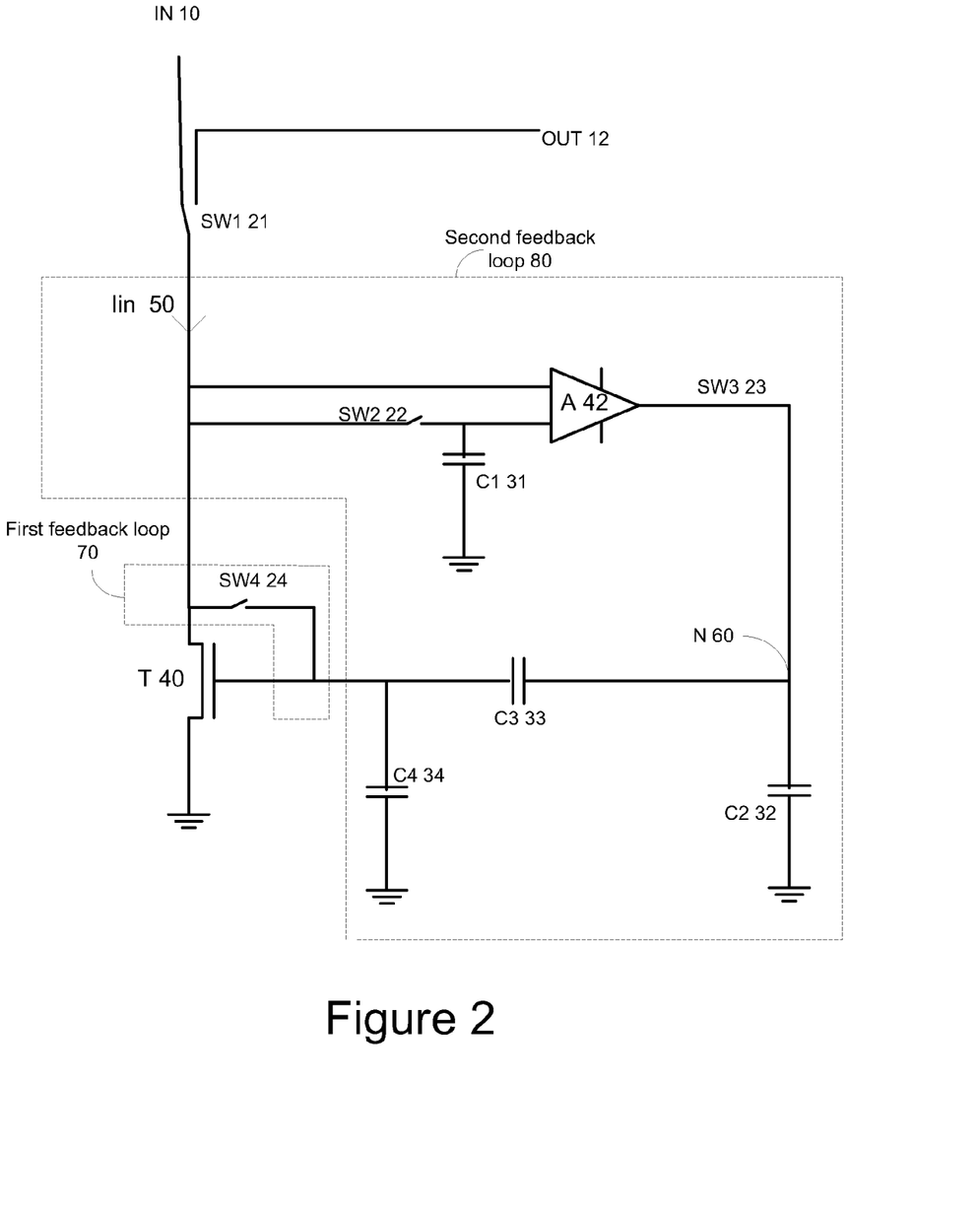
FIG. 2 illustrates a low noise analog sampling circuit during a second operational phase, according to an embodiment of the invention.

During a second operational phase of low noise analog sampling circuit 100 the second feedback loop 80 compensates for the first noise introduced by the first feedback loop and introduces a much smaller noise—an attenuated second noise.

FIG. 2 illustrates low noise analog sampling circuit 100 during a second operational phase, according to an embodiment of the invention.

At the end of the first operational phase second switch SW 22 and fourth switch SW4 24 are opened. Second switch SW2 22 is opened a short period before the fourth switch SW4 24 is opened.

After second switch SW 22 is opened the voltage on capacitor C1 31 represents the drain voltage of transistor T 40 before forth switch SW4 24 injects the first noise to the gate of transistor T 40. Accordingly, first capacitor C1 31 stores a sampled signal representative of a state of transistor T 40 a short period before the first feedback loop 70 is opened. For simplicity of explanation this sampled signal is denoted Vd(old).

The first (inverting) input of amplifier A 42 is connected to the drain of transistor T 40 and receives the current drain voltage Vd(new) of transistor T 40. The second (non-inverting) input of amplifier A 42 receives sampled voltage Vd(old) that is not affected by the first noise.

Amplifier A42 generates an amplified error signal that substantially equals G*(Vd(old)−Vd(new)), wherein G is the gain of amplifier A 42.

After a certain period the transistor T 40 and second feedback loop 80 reach a steady state and the error signal is insignificant (or at least below an acceptable level). The current drain voltage of transistor T 40 substantially equals the drain voltage of the transistor before first feedback loop 70 was opened.

This steady state is achieved while low noise analog sampling circuit 100 received Iin 50. In order to provide a sampled output signal to output node OUT 12 the second feedback loop 80 should be opened and the supply of analog input signal (Iin 50) should be stopped. The opening of the second feedback loop 80 should occur without introducing a substantial noise.

At the end of the second operational phase second feedback loop 80 is opened and introduces a second noise at node N 60. Especially, second capacitor C2 32 samples a KTC noise introduced by the opening of third switch SW3 23. The second noise is responsive to an equivalent capacitance that is the capacitances of second till fourth capacitors.

In mathematical terms:

$$SecondNoise = \sqrt{\frac{KT}{Ceq}}, \; Ceq = \frac{1}{\frac{1}{C3} + \frac{1}{C4}} + C2$$

This second noise affects the gate voltage of transistor T 40 after being attenuated by the fourth and third capacitors C3 33 and C4 34. Thus, the gate voltage of transistor T 40 is altered by an attenuated second noise. In mathematical terms:

$$SecondAttenuatedNoise = \sqrt{\frac{KT}{Ceq}} * \frac{C3}{C3 + C4}.$$

The capacitance (C3) of third capacitor C3 33 is substantially smaller than the capacitance of fourth capacitor C4 34. The attenuation factor (C3+C4/C3) can exceed ten and even exceed fifteen.

The second attenuated noise is much smaller than the first noise, thus a low noise sampling process is achieved.

The source drain current that flows through transistor T 40 is responsive to the square of the difference between the gate source voltage of transistor T 40 and the threshold voltage of transistor $$T40 \cdot I_{DS} \approx (V_G - V_T) * V_{DS} - \left(\frac{V_{DS}}{2}\right).$$

Figure 3:
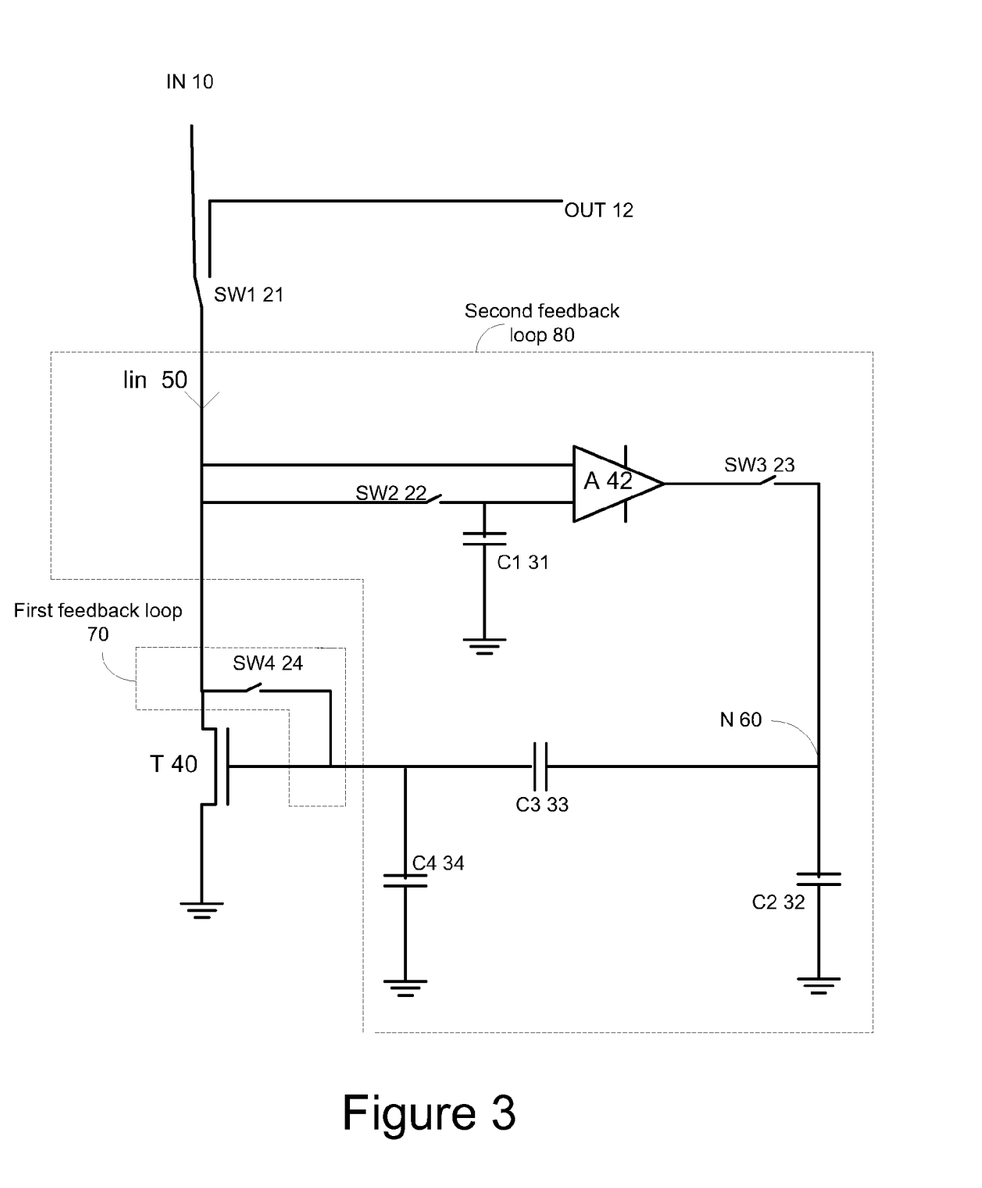
FIG. 3 illustrates a low noise analog sampling circuit during a third operational phase, according to an embodiment of the invention.
Figure 4:
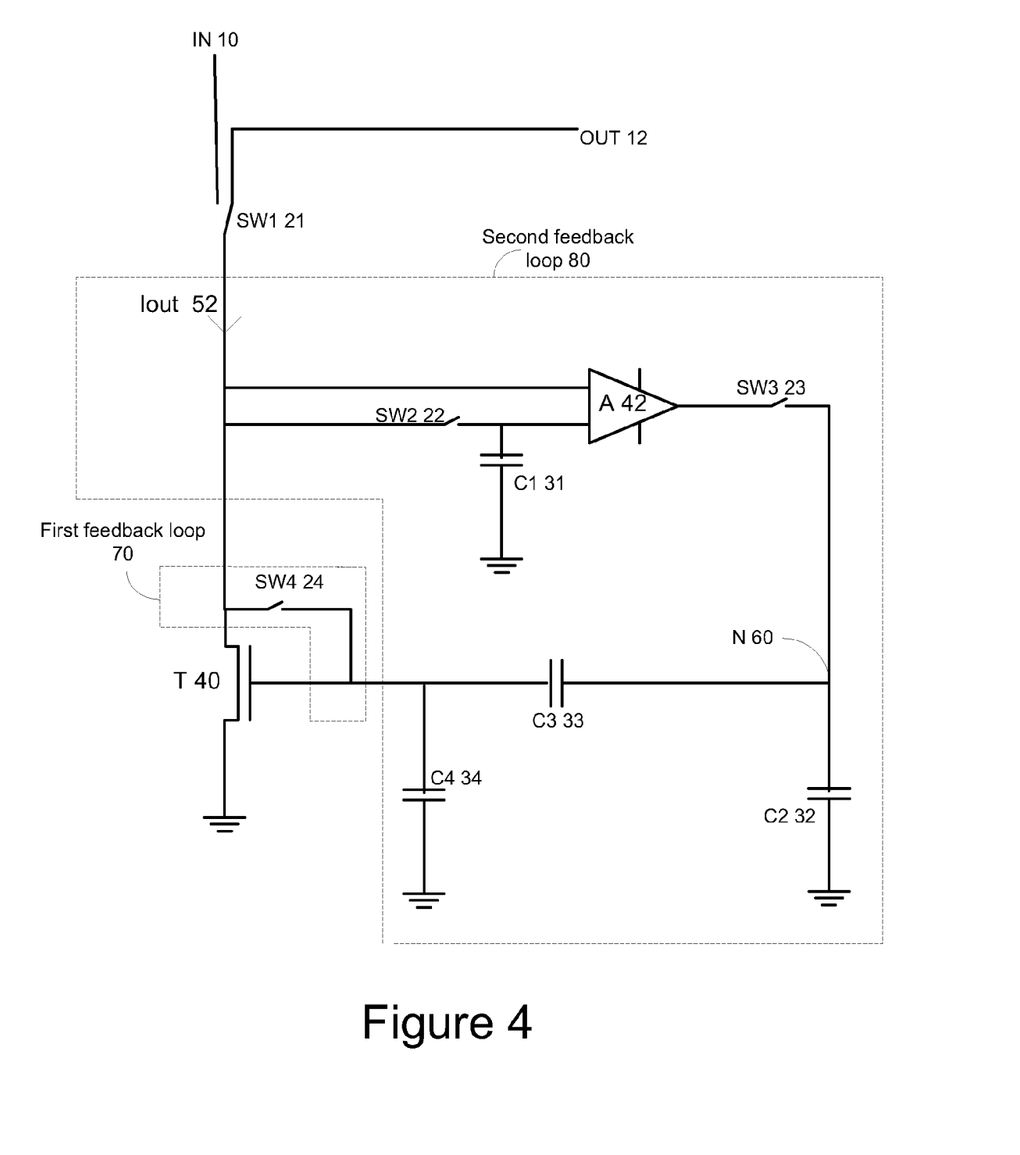
FIG. 4 illustrates a low noise analog sampling circuit during another operational phase, according to an embodiment of the invention.

FIG. 3 illustrates the opening of third switch SW3 23 during a third operational phase of operation.

After a settling period the source drain current of transistor T 40 reflects Iin 50 as well as the attenuated second noise.

During a fourth operational phase (illustrated in FIG. 4) the input switch SW1 21 connects the drain of transistor T 40 to output node OUT 12 and provides the current drain current of transistor T 40 as an output analog signal of low noise analog sampling circuit 100.

Figure 5:
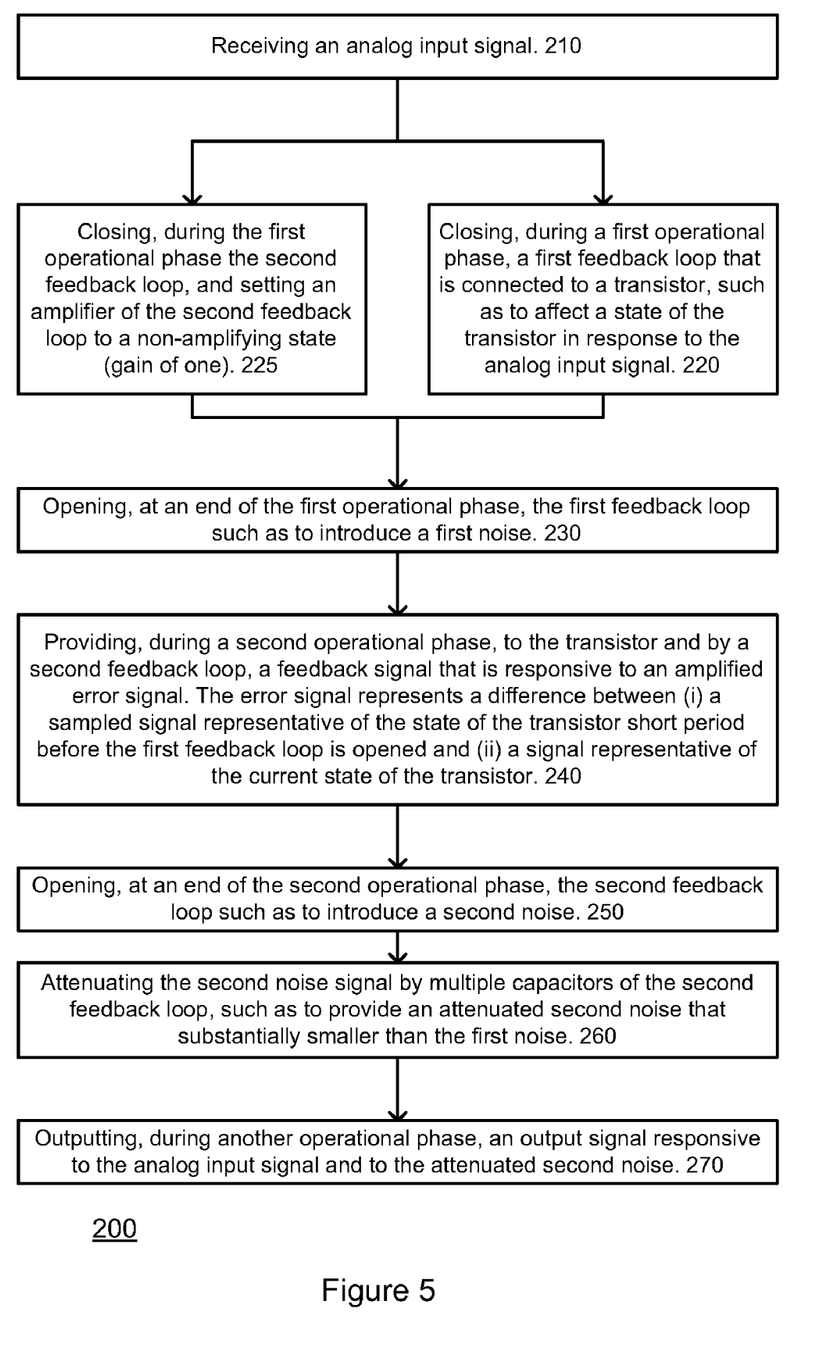
FIG. 5 illustrates a method for low noise sampling of analog signals, according to an embodiment of the invention.

FIG. 5 illustrates method 200 for low noise sampling of an analog signal according to an embodiment of the invention.

Method 200 starts by stage 210 of receiving an analog input signal. Referring to the example set forth in FIG. 1, the analog signal is input current Iin 50.

Stage 210 is followed by stages 220 and 225. Stage 220 includes closing, during a first operational phase, a first feedback loop that is connected to a transistor, such as to affect a state of the transistor in response to the analog input signal. Conveniently, the drain source current of the transistor as well as the gate source voltage of the transistor are set by the input current. The drain source current of the transistor substantially equals the input current minus currents that can flow through the first and second feedback loops.

Stage 225 includes closing, during the first operational phase the second feedback loop, and setting an amplifier of the second feedback loop to a non-amplifying state (gain of one).

Stages 220 and 225 are followed by stage 230 of opening, at an end of the first operational phase, the first feedback loop such as to introduce a first noise. Referring to the example set forth in FIG. 1, fourth switch SW4 24 of first feedback loop 70 is opened and a KTC noise is stored at fourth capacitor C4 34. The gate voltage of the transistor, the gate drain voltage of the transistor and the drain source current of the transistor are responsive to the fourth capacitor voltage. Accordingly, the first noise affects these voltages and current.

Stage 230 is followed by stage 240 of providing, during a second operational phase, to the transistor and by a second feedback loop, a feedback signal that is responsive to an amplified error signal. The error signal represents a difference between (i) a sampled signal representative of the state of the transistor short period before the first feedback loop is opened and (ii) a signal representative of the current state of the transistor.

Conveniently, stage 240 includes setting the amplifier to an amplifying state (gain differs than one).

According to an embodiment of the invention stage 240 is preceded by providing to the amplifier: (i) a sampled signal representative of a state of the transistor a short period before the first feedback loop is opened and (ii) a signal representative of a current state of the transistor. The sampled signal is sampled by a first capacitor of the second feedback loop.

Stage 240 is followed by stage 250 of opening, at an end of the second operational phase, the second feedback loop such as to introduce a second noise.

Stage 250 is followed by stage 260 of attenuating the second noise signal by multiple capacitors of the second feedback loop, such as to provide an attenuated second noise that substantially smaller than the first noise.

Stage 260 conveniently includes attenuating the second noise by a capacitor voltage divider that includes a third capacitor and a fourth capacitor, wherein a capacitance of the third transistor is substantially smaller than a capacitance of the fourth capacitor.

Conveniently, stage 260 of attenuating includes attenuating the second noise by an attenuation factor that is responsive to a relationship between a capacitance of third and fourth capacitors that belong to the second feedback loop. Conveniently, the attenuation factor exceeds ten and can even exceed fifteen.

Stage 260 is followed by stage 270 of outputting, during another operational phase, an output signal responsive to the analog input signal and to the attenuated second noise.

Conveniently, stage 240 includes charging, during the second operational phase, a second capacitor of the second feedback loop to a voltage level that is responsive to the amplified error signal. The feedback signal provided to the transistor is provided to the second capacitor via a third switch. Stage 250 conveniently includes opening the third switch such as to introduce the second noise to the second capacitor. Stage 260 conveniently includes attenuating the second noise by a third and a fourth capacitors of the second feedback loop.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

I claim:

1. A low noise analog sampling circuit comprising a transistor coupled to a first feedback loop and to a second feedback loop;

wherein during a first operational phase, the first feedback loop is closed such as to affect a state of the transistor in response to an analog input signal; wherein at an end of the first operational phase the first feedback loop is opened and introduces a first noise;

wherein during a second operational phase the second feedback loop provides the transistor a feedback signal that is responsive to an amplified error signal;

wherein the error signal represents a difference between (i) a sampled signal representative of a state of the transistor short period before the first feedback loop is opened and (ii) a signal representative of a current state of the transistor;

wherein at an end of the second operational phase the second feedback loop is opened and introduces a second noise that is attenuated by multiple capacitors of the second feedback loop such as to provide an attenuated second noise that substantially smaller than the first noise; wherein during another operational phase the transistor outputs an output signal responsive to the analog input signal and to the attenuated second noise; and wherein during the first operational phase the second feedback loop is closed and an amplifier of the second feedback loop is set to a non-amplifying state.

2. The low noise analog sampling circuit according to claim 1 during the second operational phase the amplifier is set to an amplifying state.

3. A low noise analog sampling circuit comprising a transistor coupled to a first feedback loop and to a second feedback loop;

wherein during a first operational phase, the first feedback loop is closed such as to affect a state of the transistor in response to an analog input signal; wherein at an end of the first operational phase the first feedback loop is opened and introduces a first noise;

wherein during a second operational phase the second feedback loop provides the transistor a feedback signal that is responsive to an amplified error signal;

wherein the error signal represents a difference between (i) a sampled signal representative of a state of the transistor short period before the first feedback loop is opened and (ii) a signal representative of a current state of the transistor;

wherein at an end of the second operational phase the second feedback loop is opened and introduces a second noise that is attenuated by multiple capacitors of the second feedback loop such as to provide an attenuated second noise that substantially smaller than the first noise; wherein during another operational phase the transistor outputs an output signal responsive to the analog input signal and to the attenuated second noise; and wherein the second feedback loop comprises a second capacitor that is charged, during the second operational phase, to a voltage level that is responsive to the amplified error signal;

wherein the amplified error signal is provided to the second capacitor via a third switch;

wherein at the end of the second operational phase the third switch is opened and introduces the second noise to the second capacitor; and wherein the second noise is attenuated by a third and a fourth capacitors of the second feedback loop such as to provide to the transistor an attenuated second noise.

4. A low noise analog sampling circuit comprising a transistor coupled to a first feedback loop and to a second feedback loop;

wherein during a first operational phase, the first feedback loop is closed such as to affect a state of the transistor in response to an analog input signal; wherein at an end of the first operational phase the first feedback loop is opened and introduces a first noise;

wherein during a second operational phase the second feedback loop provides the transistor a feedback signal that is responsive to an amplified error signal;

wherein the error signal represents a difference between (i) a sampled signal representative of a state of the transistor short period before the first feedback loop is opened and (ii) a signal representative of a current state of the transistor;

wherein at an end of the second operational phase the second feedback loop is opened and introduces a second noise that is attenuated by multiple capacitors of the second feedback loop such as to provide an attenuated second noise that substantially smaller than the first noise; wherein during another operational phase the transistor outputs an output signal responsive to the analog input signal and to the attenuated second noise; and wherein second noise is attenuated by an attenuation factor that is responsive to a relationship between a capacitance of third and fourth capacitors.

5. The low noise analog sampling circuit according to claim 4 wherein the attenuation factor exceeds ten.

6. The low noise analog sampling circuit according to claim 4 wherein the attenuation factor exceeds fifteen.

7. A low noise analog sampling circuit comprising a transistor coupled to a first feedback loop and to a second feedback loop;

wherein during a first operational phase, the first feedback loop is closed such as to affect a state of the transistor in response to an analog input signal; wherein at an end of the first operational phase the first feedback loop is opened and introduces a first noise;

wherein during a second operational phase the second feedback loop provides the transistor a feedback signal that is responsive to an amplified error signal;

wherein the error signal represents a difference between (i) a sampled signal representative of a state of the transistor short period before the first feedback loop is opened and (ii) a signal representative of a current state of the transistor;

wherein at an end of the second operational phase the second feedback loop is opened and introduces a second noise that is attenuated by multiple capacitors of the second feedback loop such as to provide an attenuated second noise that substantially smaller than the first noise; wherein during another operational phase the transistor outputs an output signal responsive to the analog input signal and to the attenuated second noise; and wherein the second feedback loop comprises an amplifier that comprises a first input and a second input, the first input of the amplifier is coupled to a drain of the transistor and the second input of the amplifier is coupled to a second end of a second switch;

wherein a first end of the second switch is coupled to the drain of the transistor;

wherein short period before the first feedback loop is opened the second switch is opened so that the first capacitor stores a sampled signal representative of the state of the transistor short period before the first feedback loop is opened; and wherein the amplifier outputs, during the second operational phase, the amplifier error signal.

8. The low noise analog sampling circuit according to claim 7 wherein the second feedback loop comprises an amplifier, an output of the amplifier is coupled to a first end of a third switch, a second end of the third switch is coupled to a first end of a second capacitor and to a first end of a third capacitor, a second end of the third capacitor is coupled to a gate of the transistor and to a first end of a fourth capacitor, and wherein a capacitance of the third transistor is substantially smaller than a capacitance of the fourth capacitor.

9. A method for low noise sampling of an analog signal, the method comprises:

receiving an analog input signal;

closing, during a first operational phase, a first feedback loop that is coupled to a transistor, such as to affect a state of the transistor in response to the analog input signal;

opening, at an end of the first operational phase, the first feedback loop such as to introduce a first noise;

providing, during a second operational phase, to the transistor and by a second feedback loop, a feedback signal that is responsive to an amplified error signal; wherein the error signal represents a difference between (i) a sampled signal representative of a state of the transistor short period before the first feedback loop is opened and (ii) a current state of the transistor;

opening, at an end of the second operational phase, the second feedback loop such as to introduce a second noise;

attenuating the second noise signal by multiple capacitors of the second feedback loop, such as to provide an attenuated second noise that substantially smaller than the first noise;

outputting, during another operational phase, an output signal responsive to the analog input signal and to the attenuated second noise; and closing, during the first operational phase the second feedback loop, and setting an amplifier of the second feedback loop to a non-amplifying state.

10. The method according to claim 9 wherein the providing comprises setting the amplifier to an amplifying state.

11. A method for low noise sampling of an analog signal, the method comprises:
- receiving an analog input signal;
- closing, during a first operational phase, a first feedback loop that is coupled to a transistor, such as to affect a state of the transistor in response to the analog input signal;
- opening, at an end of the first operational phase, the first feedback loop such as to introduce a first noise;
- providing, during a second operational phase, to the transistor and by a second feedback loop, a feedback signal that is responsive to an amplified error signal; wherein the error signal represents a difference between (i) a sampled signal representative of a state of the transistor short period before the first feedback loop is opened and (ii) a current state of the transistor;
- opening, at an end of the second operational phase, the second feedback loop such as to introduce a second noise;
- attenuating the second noise signal by multiple capacitors of the second feedback loop, such as to provide an attenuated second noise that substantially smaller than the first noise;
- outputting, during another operational phase, an output signal responsive to the analog input signal and to the attenuated second noise; and
- charging, during the second operational phase, a second capacitor of the second feedback loop to a voltage level that is responsive to the amplified error signal; wherein the providing comprises providing the amplified error signal to the second capacitor via a third switch; wherein the opening comprises opening the third switch such as to introduce the second noise to the second capacitor; and wherein the attenuating comprises attenuating the second noise by a third and a fourth capacitors of the second feedback loop.

12. A method for low noise sampling of an analog signal, the method comprises:
- receiving an analog input signal;
- closing, during a first operational phase, a first feedback loop that is coupled to a transistor, such as to affect a state of the transistor in response to the analog input signal;
- opening, at an end of the first operational phase, the first feedback loop such as to introduce a first noise;
- providing, during a second operational phase, to the transistor and by a second feedback loop, a feedback signal that is responsive to an amplified error signal; wherein the error signal represents a difference between (i) a sampled signal representative of a state of the transistor short period before the first feedback loop is opened and (ii) a current state of the transistor;
- opening, at an end of the second operational phase, the second feedback loop such as to introduce a second noise;
- attenuating the second noise signal by multiple capacitors of the second feedback loop, such as to provide an attenuated second noise that substantially smaller than the first noise; and
- outputting, during another operational phase, an output signal responsive to the analog input signal and to the attenuated second noise;
- wherein the attenuating comprises attenuating by an attenuation factor that is responsive to a relationship between a capacitance of third and fourth capacitors that belong to the second feedback loop.

13. The method according to claim 12 wherein the attenuation factor exceeds ten.

14. The method according to claim 12 wherein the attenuation factor exceeds fifteen.

15. The method according to claim 9 wherein the opening is preceded by providing to the amplifier: (i) a sampled signal representative of a state of the transistor a short period before the first feedback loop is opened and (ii) a signal representative of a current state of the transistor; wherein the sampled signal is sampled by a first capacitor of the second feedback loop.

16. The method according to claim 9 wherein the attenuating comprises attenuating a second noise by a capacitor voltage divider that comprises third capacitor and a fourth capacitor, wherein a capacitance of the third transistor is substantially smaller than a capacitance of the fourth capacitor.

* * * * *